United States Patent
Hembree (10) Patent No.: US 11,329,026 B2
(45) Date of Patent: May 10, 2022

(54) APPARATUSES AND METHODS FOR INTERNAL HEAT SPREADING FOR PACKAGED SEMICONDUCTOR DIE

(71) Applicant: MICRON TECHNOLOGY, INC., Boise, ID (US)

(72) Inventor: David R. Hembree, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 105 days.

(21) Appl. No.: 15/046,078

(22) Filed: Feb. 17, 2016

(65) Prior Publication Data
US 2017/0236804 A1    Aug. 17, 2017

(51) Int. Cl.
| H01L 23/367 | (2006.01) |
| H01L 25/065 | (2006.01) |
| H01L 23/42 | (2006.01) |
| H01L 23/053 | (2006.01) |
| H01L 23/31 | (2006.01) |
| H01L 25/18 | (2006.01) |

(52) U.S. Cl.
CPC ........ *H01L 25/0657* (2013.01); *H01L 23/053* (2013.01); *H01L 23/3107* (2013.01); *H01L 23/3675* (2013.01); *H01L 23/3677* (2013.01); *H01L 23/42* (2013.01); *H01L 25/18* (2013.01); *H01L 2225/06568* (2013.01); *H01L 2225/06582* (2013.01); *H01L 2225/06589* (2013.01)

(58) Field of Classification Search
CPC .................................................. H01L 23/3675
USPC ......................................................... 257/713
See application file for complete search history.

(56) References Cited

U.S. PATENT DOCUMENTS

| 7,307,348 | B2 | 12/2007 | Wood et al. |
| 7,371,676 | B2 | 5/2008 | Hembree |
| 7,682,962 | B2 | 3/2010 | Hembree |
| 9,461,029 | B2 | 10/2016 | Jang et al. |
| 10,037,978 | B2* | 7/2018 | Rahimo ............... H01L 29/0834 |
| 2005/0230802 | A1* | 10/2005 | Vindasius ............... H01L 23/34 257/686 |
| 2008/0054436 | A1 | 3/2008 | Baek |

(Continued)

FOREIGN PATENT DOCUMENTS

| CN | 102280418 A | 12/2011 |
| JP | 10233474 A | 9/1998 |

(Continued)

OTHER PUBLICATIONS

International Search Report and Written Opinion for PCT/US2017/016941 dated May 19, 2017, pp. all.

(Continued)

*Primary Examiner* — Hsin Yi Hsieh
(74) *Attorney, Agent, or Firm* — Dorsey & Whitney LLP (57) ABSTRACT

Apparatuses and methods for internal heat spreading for packaged semiconductor die are disclosed herein. An example apparatus may include a plurality of die in a stack, a bottom die supporting the plurality of die, a barrier and a heat spreader. A portion of the bottom die may extend beyond the plurality of die and a top surface of the bottom die extending beyond the plurality of die may be exposed. The barrier may be disposed alongside the plurality of die and the bottom die, and the heat spreader may be disposed over the exposed top surface of the bottom die and alongside the plurality of die.

8 Claims, 6 Drawing Sheets

(56) References Cited

U.S. PATENT DOCUMENTS

| | | |
|---|---|---|
| 2008/0093733 A1 | 4/2008 | Hsu |
| 2008/0290505 A1 | 11/2008 | Kolan et al. |
| 2011/0042784 A1 | 2/2011 | Edwards et al. |
| 2011/0304036 A1* | 12/2011 | Son .................. H01L 23/3128 257/693 |
| 2012/0001314 A1 | 1/2012 | Schuetz |
| 2012/0171814 A1 | 7/2012 | Choi et al. |
| 2014/0084444 A1 | 3/2014 | Lin |
| 2015/0035134 A1 | 2/2015 | Hung et al. |
| 2015/0170991 A1 | 6/2015 | Li et al. |
| 2016/0013173 A1* | 1/2016 | Vadhavkar .......... H01L 23/3675 438/109 |
| 2016/0049383 A1 | 2/2016 | Woychik et al. |
| 2016/0343687 A1 | 11/2016 | Vadhavkar et al. |
| 2017/0117254 A1 | 4/2017 | Hembree |

FOREIGN PATENT DOCUMENTS

| | | |
|---|---|---|
| JP | 2008235783 A | 10/2008 |
| JP | 2013529850 A | 7/2013 |
| TW | 201314848 A1 | 4/2013 |
| TW | 201426958 A | 7/2014 |
| TW | 201503315 A | 1/2015 |
| TW | 201519404 A | 5/2015 |

OTHER PUBLICATIONS

First Office Action dated Oct. 30, 2017 for Taiwanese Application No. 106105192; pp. all.

Extended European Search Report received in EP Application No. 17753656.2 dated Sep. 20, 2019.

JP Office Action dated Jul. 2, 2019 for Application No. 2018-543091, 5 pages.

First Office Action for KR Application No. 10-2018-7026296 dated Feb. 16, 2020, 7 pgs.

Second JP Office Action for JP Application No. 2018-543091 dated Feb. 4, 2020, 7 pgs.

English translation of Notice of Rejection Grounds for JP Application No. 2018-543091 dated Nov. 10, 2020.

English translation of Office Action for KR Application No. 10-2018-7026296, dated Nov. 30, 2020.

English translation of Office Action for CN Application No. 201780011784.X, dated Feb. 2, 2021.

EP Office Action dated Jun. 17, 2021 for EP Application No. 17753656.2.

Second CN Office Action dated Jul. 16, 2021 for CN Appl. No. 201780011784.X.

* cited by examiner

APPARATUSES AND METHODS FOR INTERNAL HEAT SPREADING FOR PACKAGED SEMICONDUCTOR DIE

BACKGROUND

The evolution of electronics is forcing component manufacturers to develop smaller devices while providing greater functionality and speed. The combination of smaller sizes with improved operational goals may lead to an increase in internal heat generation. The increase in heat generation may be due to a variety of factors, for example, higher operating powers, increased number of die within a single package, and crowded host devices with minimal heat dissipation. For the components to continue to provide the desired performance, the additional heat needs to be dissipated through multiple layers at faster rates. At a time when components (and the systems including the components) were larger, dissipation of additional heat may have been more easily accomplished due to heat dissipating bulk materials and/or air flow around the components. Currently, however, small, high speed devices and components containing multiple die may benefit from packaging that provides higher thermal conductivity paths for dissipating the heat generated within such devices.

DETAILED DESCRIPTION

Apparatuses and methods for internal heat spreading for packaged semiconductor die are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Thermal management of semiconductor devices is an ever increasing concern and due in part to combinations of device size and power consumption. Other factors may also contribute to thermal concerns, such as multiple die packaged together, die stacks for example, which may include multiple interfaces that may contribute to heat extraction deficiencies. At elevated operating levels, for example, the overall heat generated by a stack of die will increase, and the stacked die may exacerbate heat conduction and increase the temperature of the die stack's operating environment. For example, a stack of die may present a difficult heat extraction configuration due to the multiple interfaces through which heat may need to travel before reaching an external surface of the package to be dissipated. Additionally, heat extraction may also be limited due to die packaging processes and/or packaging materials. The heat, if not efficiently removed from the die stack, may cause one or more die in the stack to experience temperatures above their specified maximum operating temperature limits.

Additionally, the packaging process and the packaging materials may further impair heat dissipation. For example, one or more materials included in the packaging process may move, e.g., flow, from their desired location to an undesired location during the packaging process. The flow of the one or more materials may be due to their physical characteristics, such as viscosity, and further due to capillary action that small features within a packaged die stack may induce. The one or more materials may also be characterized as being relatively poor thermal conductors. Thus, the combination of the one or more materials flowing to an undesirable location and their relatively poor thermal conductivity may reduce the overall thermal dissipation of packaged semiconductor die stacks.

Figure 1:
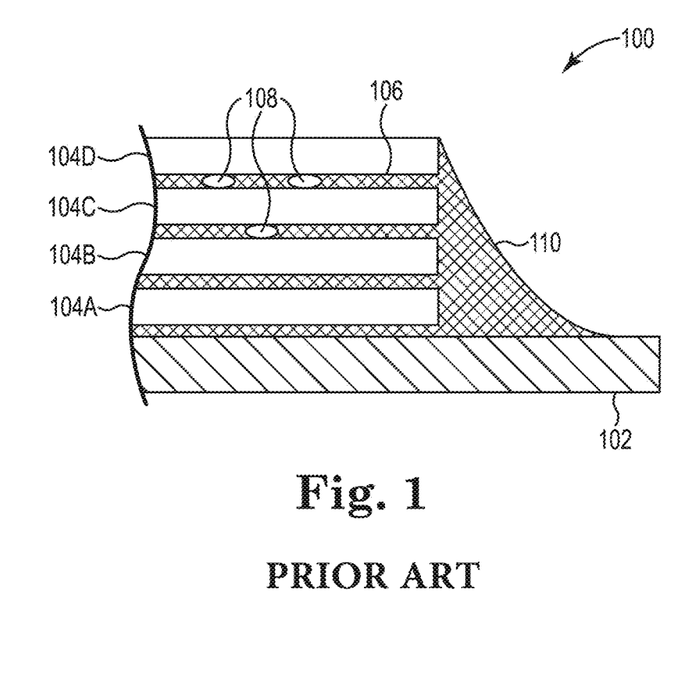
FIG. 1 is an example illustration of a die stack.

FIG. 1 is an example illustration of a die stack 100. The die stack 100 includes a die 102 and a plurality of die 104. The number of die depicted in FIG. 1 is for illustrative purposes only, and any number of die falls within the scope of the present disclosure. For illustrative purposes, the die stack 100 also includes an under fill material 106, which may have been formed during one or more packaging process steps. The die stack 100 may represent a packaged die stack or a die stack that has been partially packaged and may be used to illustrate one or more potential problems associated with packaged die stacks. Additional packaging materials are not shown so as not to obscure aspects of the partially packaged die stack 100 that are to be discussed. The additional packaging aspects may be depicted in FIGS. 2, 3, 4 and/or 5 and will be discussed in more detail below.

The die 102 and the plurality of die 104 may be any semiconductor die. For example, the die 102 may be a logic die and the plurality of die 104 may be memory die having memory circuits for storing data, such as volatile memory die, non-volatile memory die, or combinations thereof. The die 102 and the plurality of die 104 may be electrically and physically coupled to one another through one or more metallic bonds (not shown) that may have been formed during one or more fabrication steps. The one or more fabrication steps may be a combination of semiconductor die processing steps and packaging fabrication steps. For example, each of the die 102, 104 may have one or more bonding pad sites formed on a top and/or bottom side of the die 102, 104. The one or more metallic bonds are formed on the one or more bonding pad sites so that the die in the stack may be bonded to adjacent die that are above and/or below. In some embodiments, the die 102, 104 may be coupled electrically by through silicon vias (TSVs) formed in each of the die 102, 104. After the metallic bonds are formed, each of the die 102 and 104 may be separated from adjacent die by around 30 to 50 microns, e.g., spacing may occur between the die. For example, after bond formation, the space between the die 102 and the die 104A may be about 30 microns. The space between each of the die 102, 104, for example, may be at least partially due to the size of the metallic bonds coupling the die of the die stack 100. The cause of the spacing and/or the dimensions of the spacing, however, are not limiting aspects of the present disclosure.

The under fill material 106 may be a high viscosity material that, when cured, may provide structural support to the die stack 100, for example. In some embodiments, the under fill material 106 may also provide heat dissipation paths for the die stack 100. The thermal conductivity of the under fill material 106 may be greater than air, for example. The under fill material 106 may be applied and formed during one or more packaging process steps. For example, the under fill material 106 may be dispensed along or on the vertical sides of the plurality of die 104 and onto, at least portions of, the die 102 and subjected to one or more processes enabling the under fill material 106 to penetrate and fill the spaces between the die 102, 104. For example, the under fill material 106 may fill the spaces between the die 102, 104 due to a capillary effect. A subsequent heating step may be used to cure the under fill material 106.

The under fill material 106, however, may in some instances wick out (e.g., seep or flow) from the spaces between the die 102, 104 and pool at a base of the die 104 and on top of at least a portion of the die 102. The wicking and pooling of the under fill material 106 may lead to the formation of a fillet 110 of the under fill material 106. The wicking and pooling, e.g., the formation of the fillet 110, may occur between application of the under fill material 106 and the curing step, for example. This wicking and pooling may be due to the low viscosity of the under fill material 106, which may be prone to wicking out from between the die 102, 104 due to gravity and surface tension. As such, as the under fill material 106 begins to wick from between adjacent die 102, 104, the fillet 110 may begin to form around one or more of the die 104 and on at least a portion of the die 102. The amount of under fill material 106 in the fillet 110 may be self-limiting based on a volume of the under fill material 106 present or dispensed during processing. The volume of the under fill material 106 present may be based in part on the height of the die stack, e.g., a number of die in the plurality of die 104. For example, as the fillet 110 begins to form and reaches spaces between the die from which the under fill material is wicking, the wicking from those spaces may reduce or stop. For die stack of higher numbers of die, 8 or 12 die for example, the wicking and pooling may be more pronounced because there may be more volume of the under fill material 106 to wick and pool, and also because there may be a larger vertical distance between the forming fillet 110 and upper die in the die stack, which may lead to a larger filter. The wicking and pooling of the under fill material 106 may in some embodiments result in one or more heat dissipation and packaging concerns.

One concern may be the formation of voids between one or more of the die 102, 104. For example, as the under fill material 106 begins to wick out from between the die 104C and 104D, the wicking of the under fill material 106 may cause the formation of voids 108 in between the die 104C and 104D. The number and size of the voids 108, which may be related to the amount of pooling of the under fill material 106, may be affected, e.g., increased or decreased, based on the number of die in the die stack 100. For example, if the die stack 100 includes eight die 104, then the under fill material 106 in between the upper die in the die stack may incur larger and/or more numerous voids while the amount of under fill material 106 in the pool 110 increases. The voids 108 may form areas where the heat transfer between adjacent die may be less than areas where the under fill material 106 remains, which may result in a reduction in overall heat dissipation from the die stack 100 and/or the formation of hot spots in the die 104 underneath or above the voids 108. This reduction in heat dissipation may be due to the thermal conductivity of the voids, e.g., the thermal conductivity of air, being less than the thermal conductivity of the under fill material 106, and further due to the interfaces at boundaries of the voids 108. These voids 108 may lead to a reduction in heat dissipation and an increase in die temperature.

The above concern may also be caused by the height of the die stack 100. For example, if the die stack 100 is too high for the under fill material 106 to be wicked into the spaces between the top die of the die stack, die 104C and 104D for example, the voids between the die may be due to the lack of under fill material filling the spaces. The under fill material 106 may not wick into the spaces between the top die due to the surface tension of the under fill material not being strong enough to pull the under fill material 106 up to the top die and then into the space between the top die and the die below it.

A second concern may be a reduction in heat transfer from the die 102 to a surrounding heat sink or heat transfer component, such as a conformal packaging lid, e.g., cap. For example, the pool 110 may reduce heat transfer from areas of the die 102 that are under the pool 110. The reduction in heat transfer from areas under the pool 110 may be due to the large volume of the under fill 106 in conjunction with the low thermal conductivity of the underfill 106. As a result, a reduction in heat transfer from the die 102 may result. Further, the pool 110 of the under fill material 106 may also interfere with placement of other packaging components. For example, placement of a conformal lid (not shown) may be effected by the pool 110. The conformal lid, in some embodiments, may be formed from a material having a high thermal conductivity, and may be placed such that an internal surface of the lid comes within close proximity of the top of die 102, e.g., within 50 microns, and the sides of the plurality of die 104 so to reduce a distance heat needs to propagate to reach a heat spreader, for example. However, if the pool 110 increases the distance between the conformal lid and the die 102, 104, the distance the heat needs to propagate increases, which may lead to an increase in the temperature of the die stack 100.

During operation, the die stack 100 may heat up due to operation of the various circuits of the die 102, 104. In some instances, hot spots may form in one or more die of the die stack 100. For example, hot spots may develop in the die 102 under the die 104A. Hot spots that develop in an area of the die 102 under the die 104A may additionally limit heat transfer from the die 104A. In order for the heat to dissipate, the heat developed in the die 102 may propagate laterally through the die 102 and through the pool 110 of the under fill material 106 to a heat dissipating component of a package, such as a heat spreader (not shown). However, due to the poor thermal conductivity of the under fill material 106, the lateral propagation of the heat may be reduced, which may lead to increased heating of the die stack 100. Additionally, heat developed in the die 102 may propagate to an underlying substrate (not shown) and flow down and/or laterally to other packaging components. In some instances, the heat experienced by the die 102 and 104A may be greater than their respective recommended maximum operating temperatures.

A potential solution to limit the pooling and improve heat spreading may be to include a barrier for the under fill material 106 that provides a heat path to a packaging lid, for example. The barrier may be formed around the sides of the die 104 and may form a dam to the wicking, or excessive wicking, of the under fill material 106, for example. As such, the barrier may eliminate or reduce the amount of wicking and pooling of the under fill material 106. Further, because the barrier may be in intimate contact or in close proximity to the die 102, 104, the heat dissipation of the die 102, 104 may be improved, which may improve the overall heat dissipation and thermal performance of the die stack 100.

Figure 2:
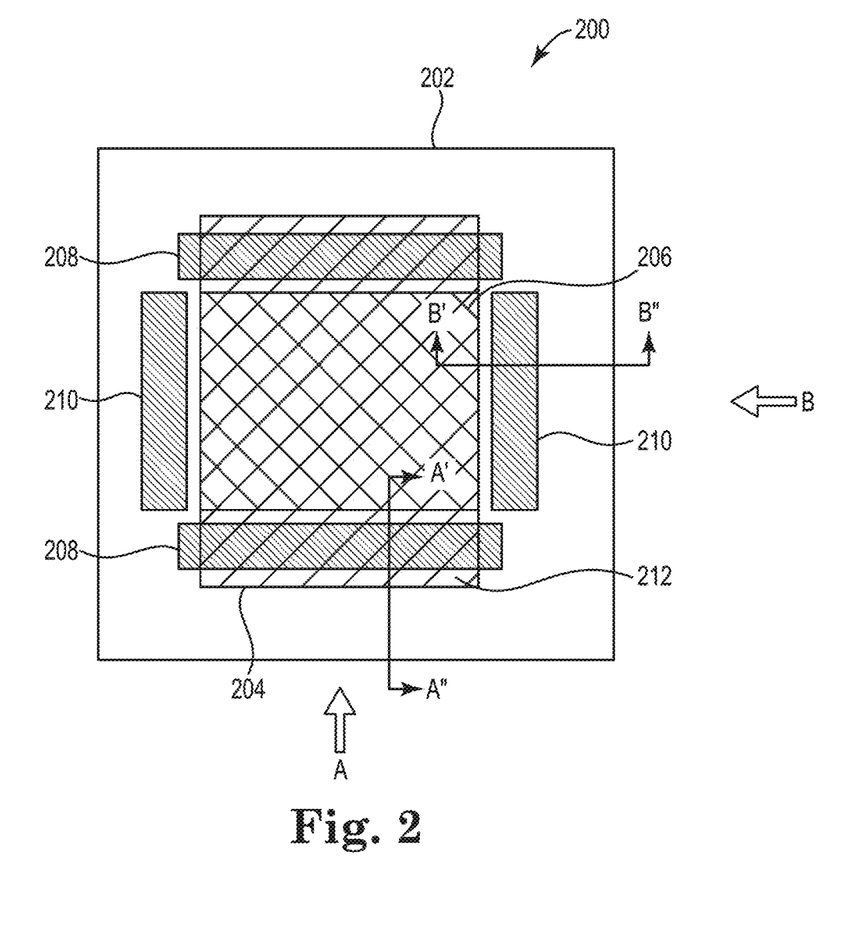
FIG. 2 is an example illustration of a plan view of a packaged die stack in accordance with an embodiment of the present disclosure.

FIG. 2 is an example illustration of a plan view of a packaged die stack 200 in accordance with an embodiment of the present disclosure. The packaged die stack 200 includes a substrate 202, a die 204, a plurality of die 206, one or more heat spreaders 208, and one or more barriers 210. The dimensions of the components depicted in FIG. 2 are not to scale and are for illustrative purposes only. The presentation of the packaged die stack 200 omits some packaging components for sake of clarity. For example, a lid, under fill material, and a thermal interface material are not shown in FIG. 2 so that the relation of the substrate 202, die 204, the plurality of die 206, one or more heat spreaders 208, and one or more barriers 210 are clearly shown. The heat spreaders 208 and barriers 210 may provide a dam for an under fill material, such as the under fill material 106 of FIG. 1. The heat spreaders 208 and barriers 210 may further provide an enhanced heat transfer path from the packaged die stack 200 to a lid (not shown).

Die 204 may be a logic die for the plurality of die 206. The plurality of die 206 may include one or more memory die, for example, four, eight, or twelve memory die. Additionally, the die 204 and 206 may be mechanically and electrically coupled similar to the die 102, 106. For example, the die 204, and the plurality of die 206 may be electrically and mechanically coupled by metallic bonds. The metallic bonds may cause the die to be separated, e.g., spaces between the die, that may be filled with an under fill material (not shown). In some embodiments, the die 204 may be larger than each of the plurality of die 206. For example, the die 204 may extend beyond the plurality of die 206 in one, two, three, or four directions, such that a portion of, or an area of, the die 204 is exposed and not covered by the plurality of die 206. The portion of the die 204 that extends beyond the plurality of die 206 may be referred to herein as a porch 212.

The heat spreaders 208 may be formed over exposed portions of the die 204, e.g., over the porch 212, and formed from metallic or non-metallic materials having a relatively high thermal conductivity, such as copper. For example, the thermal conductivity of copper is ~395 W/mK at 25° C. In some embodiments, the heat spreaders 208 may be formed from a stack of wires, such as round wires or ribbon wires, placed on top of each other to form a structure over the exposed portions of the die 204 and next to the plurality of die 206. For example, a layer of wire may be formed over the porch 211 of the die 204 with subsequent layers of wire being formed to build up the heat spreader 208 to a desired height. In some embodiments, the desired height may be commensurate with the height of the top of the plurality of die 206. In some embodiments, the heat spreaders 208 may be bonded to the substrate 202, which may have been coated with a metallic layer to aid bonding. The heat spreaders 208 may provide an enhanced thermal path to the packaged die stack 200. For example, the heat spreaders 208 may provide a thermal path from the porch 212 of the die 204 to a packaging lid (not shown).

The barriers 210 may be formed from metal or a non-metallic material having a relatively high thermal conductivity. For example, the barriers 210 may be formed from wire, such as round wire or ribbon wire. The barriers 210 may provide enhanced thermal dissipation of the packaged die stack 200. For example, the barriers 210 may enhance the thermal transfer path for heat generated in at least the die 204. The enhanced thermal transfer path may provide a thermal transfer path from the substrate 202 to a packaging lid (not shown). In some embodiments, heat propagating from the substrate 202 to the barriers 210 may originate in the die 204. For example, heat from the die 204 may propagate down into the substrate 202 before propagating through the substrate 202 to the barriers 210.

Additionally, the heat spreaders 208 and the barriers 210 may act as a dam for the under fill material applied during the packaging process. For example, during packaging of the die stack 200, e.g., the die 204, and the plurality of die 206, the heat spreaders 208 may be formed over exposed areas of the die 204, e.g., a porch area such as the porch 212, and next to or abutting the plurality of die 206, and the barriers 210 may abut the plurality of die 206 before the under fill material is applied. In this manner, the heat spreaders 208 and the barriers 210 may prevent or reduce an amount of under fill material wicking out from the spaces between the die 204, and plurality of die 206, and pooling around the base of the plurality of die 206 on portions of the die 204 and on the substrate 202.

During a packaging process, the under fill material may be applied to the die stack 200 after the die stack is formed and after formation or placement of the heat spreaders 208 and the barriers 210. By placing the heat spreaders 208 and the barriers 210 around the plurality of die 206 before applying the under fill material, the wicking and pooling of the under fill material may be reduced or eliminated. For example, the under fill material may be applied around the edges of the plurality of die 206 so that the under fill material may be contained within the heat spreaders 208 and the barriers 210. The die stack 200 with the under till material may then be subjected to a heat process so that the under fill material cures, e.g., hardens. The cured under fill material may provide structural integrity to the die stack and may also slightly enhance the heat transfer since it would be in contact with the die stack and since it is a better heat conductor than air. FIG. 2 shows gaps between the heat spreaders and barriers 210, e.g., that they are not joined, but this aspect is non-limiting and other embodiments may include metallic wires formed in a continuous loop around the plurality of die stack, the continuous loop of wire forming the heat spreaders 208 and the barriers 210, for example.

FIGS. 3A through 3D are example illustrations of side views and cross-sectional views of a packaged die stack 300 in accordance with an embodiment of the present disclosure. The example illustrations shown in FIGS. 3A-3D omit some packaging components so not to obscure various features disclosed herein and to aid in clarity of the disclosure. For example, a packaging lid, an under fill material, and a thermal interface material are omitted so as not to obscure aspects of the present disclosure. The packaged die stack 300 may be an example of a packaged die stack 200 shown in FIG. 2. The packaged die stack 300 of FIGS. 3A-3D includes a substrate 302, a die 304 and a plurality of die 306, and a heat spreader 308. The heat spreader 308 may provide an enhanced heat transfer path from the die 304 and the plurality of die 306, and a dam to under fill wicking and pooling as discussed in FIG. 1.

Figure 3A:
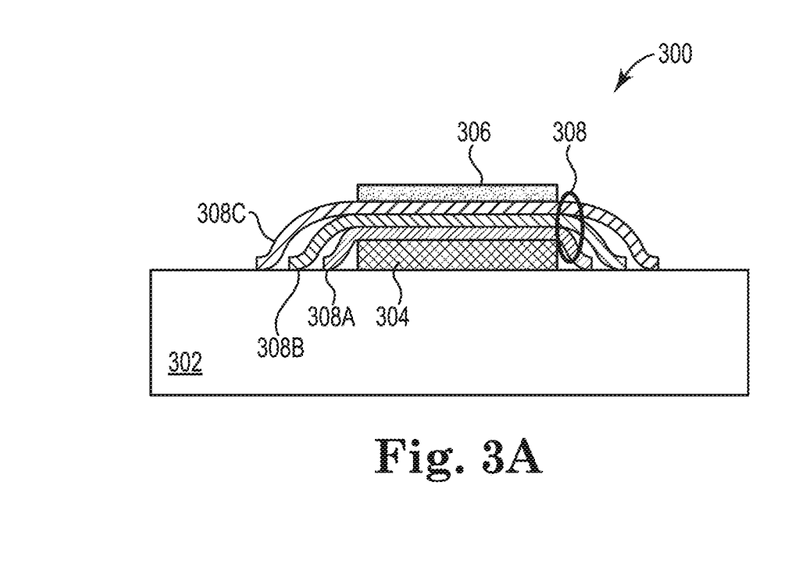
FIGS. 3A through 3D are example illustrations of side views and cross-sectional views of a packaged die stack in accordance with an embodiment of the present disclosure.

FIG. 3A is a side view of the packaged die stack 300 looking along the direction A shown in FIG. 2. The substrate 302 may be a packaging substrate, and may be formed from a number of layers of organic material, fiber glass for example, and metal, copper for example. The layers of organic material and copper may be formed to provide conductive paths from a bottom side of the substrate 302 to a top side of the substrate, where the die 304, for example, may be bonded to the top side of the substrate 302. The bottom side of the substrate 302 may include metallic bonding pads that allow for bonding the packaged die stack 300 to a circuit board, for example, and for communication paths between a host system and the packaged die stack 300.

The die 304 may be a logic die or a system on a chip, for example, and may be bonded to the top side of the substrate 302 at a bottom side of the die 304. On a top side of the die 302, the plurality of die 306 may be disposed. A bottom die of the plurality of die 306 may be bonded to the top side of the die 304 using a compression bonding process to form metallic bonds coupling the die. The rest of the die may be bonded using a similar process. The plurality of die 306 may be memory die, volatile memory, non-volatile memory, or combinations thereof, and may communicate through TSVs with the die 304.

The die 304 may extend beyond the plurality of die 306 on one, two, three, or four sides. As such, the area of the die 304 that extends beyond the die 306 may be exposed on its top surface. FIG. 3A shows only one side for illustrative purposes only. The area or portion of the die 304 that extends beyond the die 306 may be referred to as a porch area. In some embodiments, the porch area may generate heat when the die 304 is performing operations, which may need to be dissipated. If an under fill material pools onto the porch area, as discussed above, heat dissipation may be hindered. The heat spreader 308, which is formed over the porch area and which may contact with the porch area may provide an enhanced heat transfer path and/or a dam to under fill material pooling on the porch area.

The heat spreader 308 may be formed from several layers of round metallic wire, copper for example, which may be bonded to the substrate 302 at both ends of the wire. For example, a first layer of the heat spreader 308, such as 308A, may be bonded to the substrate 302 at one end, extended up and over the porch area of the die 304, then bonded to the substrate 302 on the other side of the die 304. The steps may be repeated for additional wires to form each layer, such as layers 308A, 308B, and 308C, and a number of layers may be formed on top of one another so that the heat spreader 308 may be approximately the same height as the top of the plurality of die 306. Although FIG. 3A shows only three layers and the heat spreader 308 being below the top of the die 306, the relative numbers and sizes of the shown components are not limiting and are shown for illustrative purposes only.

Figure 3B:
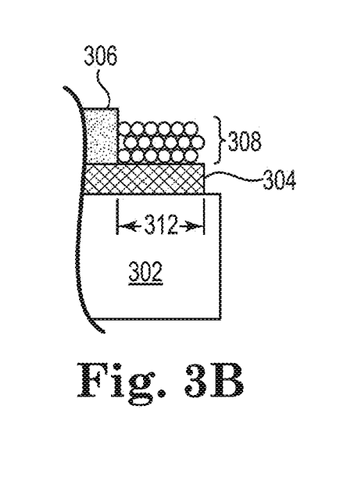

FIG. 3B shows a cross-sectional view of the packaged die stack 300 cut along the lines A'-A" shown in FIG. 2. The cross-sectional view of FIG. 3B shows the formation of the heat spreader 308 and an example arrangement of how the individual wires of the heat spreader 308 may be disposed over the porch area, e.g., a porch 312, of the die 304 and in relation to other wires. The wires forming the heat spreader 308 may be formed over the porch. In some embodiments, the heat spreader 308 may abut the sides of the plurality of die 306. In some embodiments, the heat spreader 308 may be 50 to 200 microns, for example is formed between from the plurality of die 306. The heat spreader 308 may limit an amount of under fill material (not shown) that may wick out from between the plurality of die 306 and pool on the porch area of the die 304.

Figure 3C:
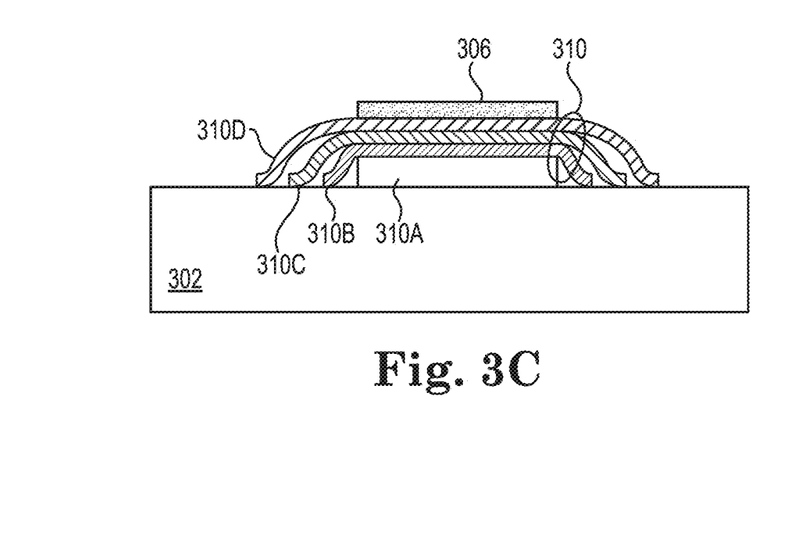

FIG. 3C is a side view of the packaged die stack 300 looking along the direction B shown in FIG. 2. The view of FIG. 3C shows the substrate 302, the barrier 310 and the die 306. In FIG. 3C there is no portion of the die 304 under the barrier 310. As such, the barrier 310 may be formed on the substrate 302. For example, the layer 310A may be initially formed on the substrate 302. The layer 310A may be formed from round metallic wire, copper for example, which has been bonded to the substrate 302 at one end, a length of the wire extended along a portion of the surface of the substrate 302, then bonded at the other end. In some embodiments, the first layer 310A may extend the length of the die 304. A second layer, such as the layer 310B, may be formed over the first layer 310A, and so on, until all layers of the barrier 310 have been formed. The barrier 310 may provide a dam to under fill material (not shown) disposed between adjacent die of the die stack 300, and further may provide an enhanced heat transfer path from the substrate 302 to a packaging lid (not shown).

Figure 3D:
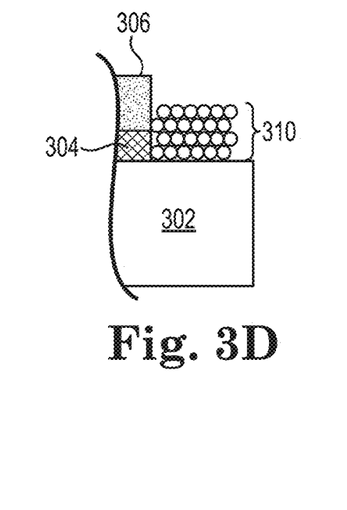

FIG. 3D shows a cross-sectional view of the packaged die stack 300 cut along the lines B'-B" shown in FIG. 2. The cross-sectional view of FIG. 31) shows the formation of the barrier 310 and an example arrangement of the individual wires of the barrier 310. The wires forming the barrier 310 may be formed on the substrate. In some embodiments, the barrier 310 may be positioned to abut the sides of the die stack 300. In some embodiments, the barrier 310 may be 50 to 200 microns, for example, from the die 304 and the plurality of die 306. The barrier 310 may limit an amount of under fill material (not shown) that may wick out from between the plurality of die stack 300 and pool on the substrate 302.

The packaged die stack 300 may benefit from the heat spreader 308 and the barrier 310. For example the heat spreader 308 and the barrier 310 may enhance the thermal dissipation of the packaged die stack 300 by providing a thermal transfer path from the die 304 and the substrate 302 to a packaging lid. Additionally, the heat spreader 308 and the barrier 310 may reduce an amount of under fill material pooling on the die 304 and the substrate 302.

FIGS. 4A through 4D are example illustrations of side views and cross-sectional views of a packaged die stack 400 in accordance with an embodiment of the present disclosure. The example illustrations shown in FIGS. 4A-4D omit some packaging components so not to obscure various features disclosed herein and to aid in clarity of the disclosure. For example, a packaging lid, an under fill material, and a thermal interface material are omitted so as not to obscure aspects of the present disclosure. The packaged die stack 400 may be an example of a packaged die stack 200 shown in FIG. 2. The packaged die stack 400 of FIGS. 4A-4D includes a substrate 402, a die 404 and a plurality of die 406, a heat spreader 408, and a barrier 410. The heat spreader 408 and the barrier 410 may collectively provide an enhanced heat transfer path from the die 404 and the plurality of die 406, and a dam to under fill wicking and pooling as discussed in FIG. 1.

The components shown in FIGS. 4A through 4D may be similar to those discussed with respect to FIGS. 3A through 3D. As such, a detailed description is omitted for sake of brevity. For example, detailed description of the substrate 402, die 404, and the plurality of die 404 are omitted.

Figure 4A:
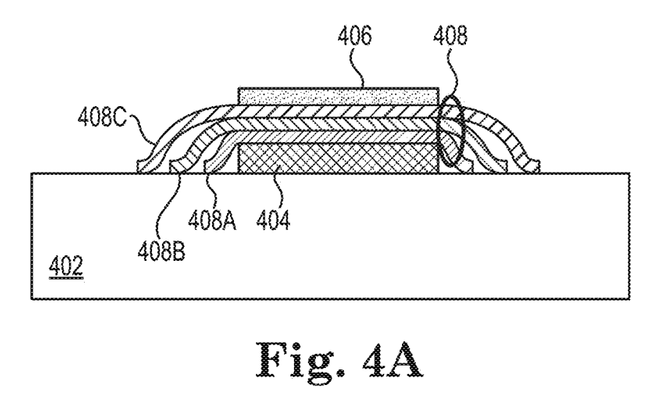
FIGS. 4A through 4D are example illustrations of side views and cross-sectional views of a packaged die stack in accordance with an embodiment of the present disclosure.

FIG. 4A is a side view of the packaged die stack 300 looking along the direction A shown in FIG. 2. The heat spreader 408 may be formed from several layers of flat metallic wire, e.g., ribbon wire, made from copper, for example. The ribbon wire may be bonded to the substrate 402 at both ends. For example, a first layer of the heat spreader 408, such as 408A, may be bonded to the substrate 402 at one end, extended up and over the porch area of the die 404, and then bonded to the substrate 402 on the other side of the die 404. The steps may be repeated for additional wires to form each layer, such as layers 408A, 408B, and 408C, and a number of layers may be formed on top of one another so that the heat spreader 408 may be approximately the same height as the top of the plurality of die 406. Although FIG. 4A shows only three layers and the heat spreader 408 being below the top of the die 406, the relative numbers and sizes of the shown components are not limiting and are shown for illustrative purposes only.

Figure 4B:
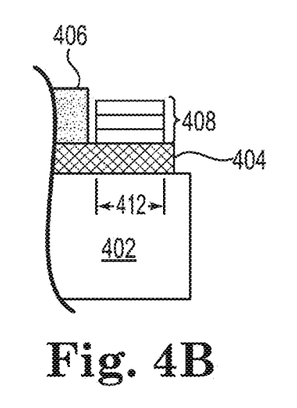

FIG. 4B shows a cross-sectional view of the packaged die stack 400 cut along the lines A'-A" shown in FIG. 2. The cross-sectional view of FIG. 4B shows the formation of the heat spreader 408 and an example arrangement of how the individual wires of the heat spreader 408 may be disposed over a porch 412 of the die 404 and in relation to other wires. The wires forming the heat spreader 408 may be formed over the porch. In some embodiments, the heat spreader 408 may abut the sides of the plurality of die 406. In some embodiments, the heat spreader 408 may be 50 to 200 microns, for example, from the plurality of die 406. The heat spreader 408 may limit an amount of under fill material (not shown) that may wick out from between the plurality of die 406 and pool on the porch area of the die 404.

Figure 4C:
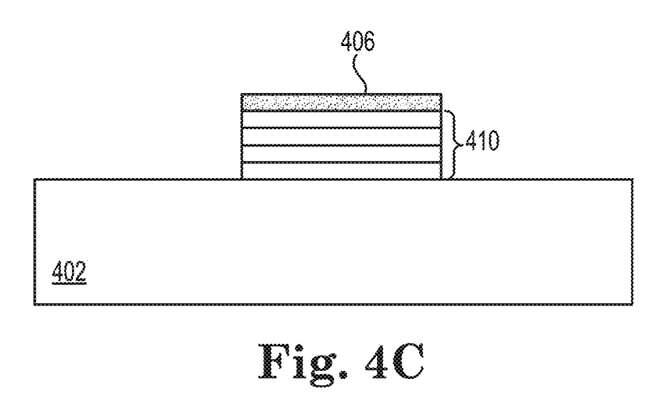

FIG. 4C is a side view of the packaged die stack 400 looking along the direction shown in FIG. 2. The view of FIG. 4C shows the substrate 402, the barrier 410 and the die 406. In FIG. 3C there is no portion of the die 404 under the barrier 310. As such, the barrier 410 may be formed on the substrate 402. For example, the layer 410A may be initially formed on the substrate 402. The layer 410A may be formed from flat metallic wire, e.g., ribbon wire, and formed from copper, for example. The first layer 410A may be bonded to the substrate 302 at one end, a length of the wire extended along a portion of the surface of the substrate 402, then bonded at the other end. In some embodiments, the first layer 410A may extend the length of the die 404. A second layer, such as the layer 41013, may be formed over the first layer 410A, and so on, until all layers of the barrier 410 have been formed. The barrier 410 may provide a dam to under fill material (not shown) disposed between adjacent die of the die stack 400, and further may provide an enhanced heat transfer path from the substrate 402 to a packaging lid (not shown).

Figure 4D:
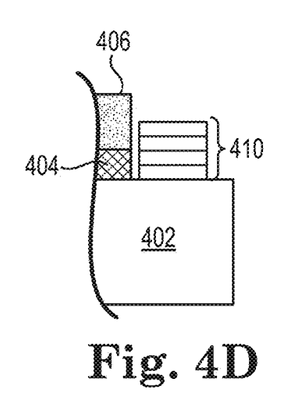

FIG. 4D shows a cross-sectional view of the packaged die stack 400 cut along the lines B'-B" shown in FIG. 2. The cross-sectional view of FIG. 4D shows the formation of the barrier 410 and an example how the individual wires of the barrier 410 are arranged. The edge of the die 404 and the die 406 are approximately aligned. The wires forming the barrier 410 may be formed on the substrate. In some embodiments, the barrier 410 may abut the die 404 and the plurality of die 406. In some embodiments, the barrier 410 may be 50 to 200 microns, for example, from the die 404 and the plurality of die 406. The barrier 410, based on its proximity to the die stack 400, may limit an amount of under fill material (not shown) that may wick out from between the plurality of die stack 400 and pool on the substrate 402.

The packaged die stack 400 may benefit from the heat spreader 408 and the barrier 410. For example the heat spreader 408 and the barrier 410 may enhance the thermal dissipation of the packaged die stack 400 by providing a thermal transfer path from the die 404 and the substrate 402 to a packaging lid. Additionally, the heat spreader 408 and the barrier 410 may reduce an amount of under fill material pooling on the die 404 and the substrate 402.

Figure 5:
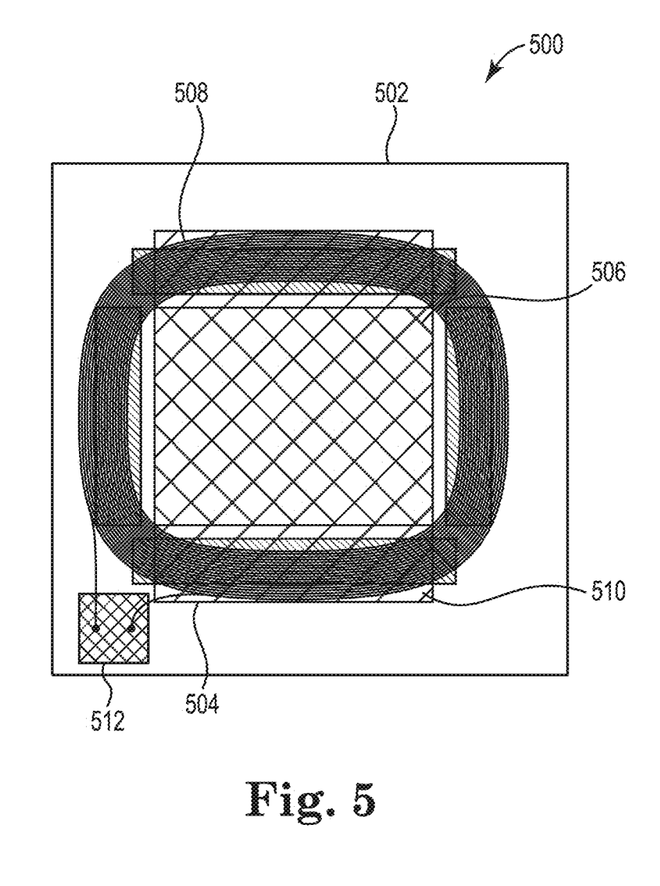
FIG. 5 is an example illustration of a plan view of a packaged die stack in accordance with an embodiment of the present disclosure.

FIG. 5 is an example illustration of a packaged die stack 500 in accordance with an embodiment of the present disclosure. The packaged die stack 500 may include a substrate 502, a die 504, a plurality of die 506, and a heat spreader 508. Many of the elements shown in FIG. 5 are similar to elements previously discussed, and as such will not be discussed in detail for sake of brevity. For example, the substrate 502, die 504, and the plurality of die 506 may be similar to components discussed with respect to FIG. 2, such as the substrate 202, die 204, and plurality of die 206. With respect of FIG. 5, the heat spreader 508 may be disposed around the plurality of die 506 and disposed on porch area 510 of the die 504. The heat spreader 508 may provide an enhanced thermal dissipation path to at least the die 504, and may further provide an under fill barrier for the packaged die stack 500.

The heat spreader 508 may be formed from a continuous length of wire formed into a loop around the plurality of die 506. The heat spreader 508 may be formed from round wire or ribbon wire. In some embodiments, the wire may be copper wire, but other wire may otherwise be used. The continuous loop may rest on, e.g., be supported by, the porch 510 extending beyond the plurality of die 506 in at least one direction. FIG. 5 shows the porch 510 extending beyond the plurality of die 506 in two directions, up and down for example, but the porch may also extend beyond the plurality of die 506 in three or four directions as well. In some embodiments, while looping the wire around the plurality of die 206, the wire may be layered so that a height of the heat spreader 508 is commensurate with a height of the plurality of die 506. Additionally, the heat spreader 508 may provide a dam to under fill material included in the packaged die stack 500. For example, the heat spreader 508 may be formed before an under fill material is dispensed into spaces between the die 504 and the plurality of die 506 so that the heat spreader 508 limits an amount of under fill material (not shown) wicks and pools on the porch 510 and around a base of the plurality of die 506. The heat spreader 508 may be looped around the plurality of die 506 by any means known in the art and the method of forming the loop of wire is a non-limiting aspect of the present disclosure.

The substrate 502 may include a bonding site 512 that provides a bonding site for the wire forming the heat spreader 508. In a non-limiting example, a wire may be bonded to the bonding site 512 and then the wire may be looped around the plurality of die 506 to form the heat spreader 508. Once the heat spreader 508 is formed, e.g., the wire has been looped around the plurality of die 506 a desired number of times, the wire may be bonded to the bonding site 512 to complete the loop and to secure the other end of the wire. The bonding site 512 may be formed from one or more metals and the ending surface may be gold.

The heat spreader 508 may be formed in various ways. For example, the wire used to form the heat spreader 508 may be held stationary while the substrate 502 (including the die 504 and the plurality of die 506) are spun to form the loop of wire. The substrate may be held by clamps or a vacuum chuck in such an embodiment. Another example may include the substrate 502. (including the die 504 and the plurality of die 506) being held stationary while a wire bonding machine, for example, loops wire around the plurality of die 506 to form the heat spreader 508.

Figure 6:
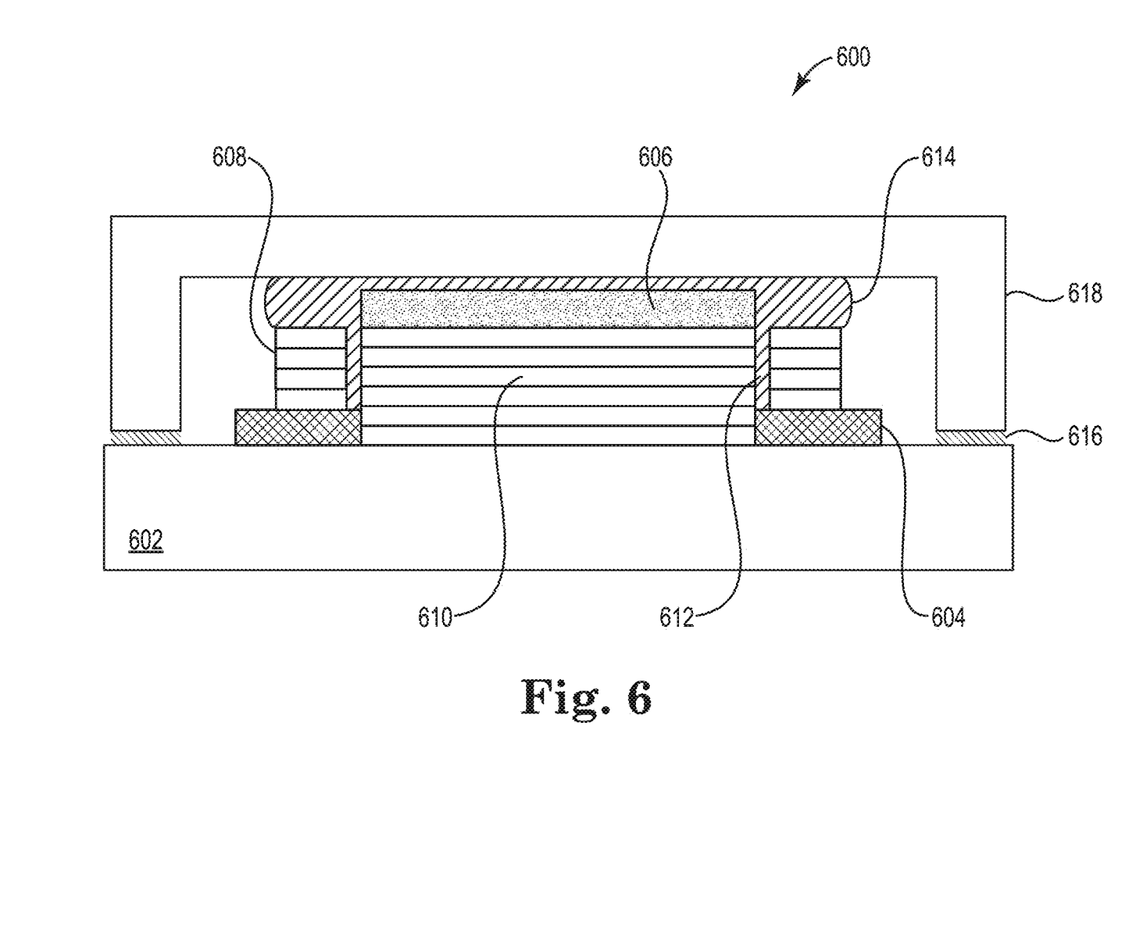
FIG. 6 is an example illustration of a packaged die stack in accordance with an embodiment of the present disclosure.

FIG. 6 is an example illustration of a packaged die stack 600 in accordance with an embodiment of the present disclosure. The packaged die stack 600 may include a substrate 602, a die 604, a plurality of die 606, one or more heat spreaders 608, and one or more barriers 608, an under fill material 612, a thermal interface material (TIM) 614, an adhesive 616, and a lid 618 The packaged die stack 600 may be a memory device in some embodiments, but the type of device is a non-limiting aspect of the present disclosure. The one or more heat spreader 608 and the one or more barriers 610 may enhance the thermal performance of the packaged die stack 600 through the reduction or elimination of under fill material 612 pooling and provide an enhanced thermal path for the die stack 600.

The substrate 602 may be a substrate for semiconductor packaging. The substrate 602 may be formed from a combination of organic materials, e.g., resins, glass fibers, etc., and may be non-conductive. In some embodiments, the substrate 602 may include multiple layers of electrical traces, and through-vias for electrical connections between the various layers of electrical traces, which may terminate at one or more contacts (not shown) for electrically coupling to the die 604. The lid 618 may be a cover for the packaged die stack 600 and may enclose the remaining components of the packaged die stack 600. The lid 618 may be attached to the substrate 602 by the adhesive 616, for example. In some embodiments, the lid 618 may promote heat dissipation into the surrounding area or to one or more heat sinks (not shown).

The TIM 614 may be formed between the top die of the plurality of die 606, exposed areas of the die 604, the heat spreaders 608 and the barriers 610, and the lid 618. The TIM 614 may be included to assist with heat transfer from the die stack 600 to the lid 618, and may also assist in mounting, e.g., attaching, the lid 618 to the other components of the packaged die stack 600. TIM 614 may provide additional mechanical support to the die stack 600 as well. The TIM 614 may be an epoxy material that may or may not include metal fillers, such as indium or gold, which may be included to enhance thermal conduction. The thickness of the TIM 614 may be from 20 to 50 microns, which may be dependent upon fabrication process and/or normal variations in the packaging process.

In a non-limiting example, each of the plurality of die 606 may be a memory die, such as non-volatile or volatile memory die. The die 604 may be an interface die or a logic die. The stack of die, including the plurality of die 206 and the die 204, may be interconnected by through-via interconnects (not shown), which may be a common bus for command and/or data signals to propagate within the die stack. The command and data signals may be externally provided to the stack of die by a host and data may be provided to the host in response. Additionally, the die 604 may receive data and command signals from one or more external components, and in response provide the data/command signals to a target die 606 of the plurality of die 606. The through-via interconnects may be coupled to one or more bonding pads (not shown) formed on a top side and/or a bottom side each of the die 602, 604. Additionally, the bonding pads may be locations for forming metallic bonds between adjacent die of the packaged die stack 600, analogous to the metallic bonds discussed above with reference to FIG. 1.

The die 604 may be a bottom die of the packaged die stack 600, and may support the plurality of die 606. Additionally, each of the die 604, 606 may be separated from an adjacent die 604, 606 due at least in part to the metallic bonds coupling the die. The space between the adjacent die may be filled with an under fill material 612. Filling the spaces between the die with the under fill material 612, as discussed above, may provide structural support to the packaged die stack 600, and may also provide thermal dissipation.

The die stacks depicted in FIGS. 2 through 6 are for illustrative purposes only and are not limiting. All possible variations in the number of die in the stack and the types of die in the stack are within the scope of the present disclosure. For example, an interposer die may be inserted between a die 604 and the bottom die of the plurality of die 606, for example, which may provide further structural stability and thermal enhancement.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
a plurality of die stacked in a first direction and having sides extending in the first direction;
a bottom die bonded with a bottom of the plurality of die, the bottom die including sides extending in the first direction, wherein at least a first side of the sides of the bottom die aligns with a first side of the sides of the plurality of die;
a substrate having bonded with a bottom side of the bottom die; and
a barrier comprising a plurality of layers of wire arranged in a stack and disposed along the first side of the sides of the plurality of die and along the first side of the sides of the bottom die, wherein the barrier comprises at least:
a first layer of wire formed on a top side of the substrate, wherein a length of the first layer of wire extends along the first side of the sides of the bottom die and the first side of the sides of the plurality of die, the first layer of wire comprising one or more wires each of the one or more wires having a first end and a second end each of the first end and the second end bonded to the top side of the substrate; and
a second layer of wire stacked over the first layer of wire in the first direction, wherein a length of the second layer of wire extends along the first side of the sides of the bottom die and the first side of the sides of the plurality of die, the second layer of wire comprising one or more wires each of the one or more wires having a first end and a second end each of the first end and the second end bonded to the top side of the substrate.

2. The apparatus of claim 1 further comprising a heat spreader, wherein a portion of the bottom die extends beyond the plurality of die in a second direction perpendicular to the first direction from a second side of the sides of the plurality of die, wherein the portion comprises a top surface not overlapped with the plurality of die in the first direction, and wherein the heat spreader is disposed on the top surface of the bottom die along with the second side of the sides of the plurality of die, wherein the head spreader comprises a plurality of wires arranged in a stack, each of the plurality of wires having a first end and a second end each of the first end and the second end extending beyond the top surface of the bottom die to be in direct contact with the substrate.

3. The apparatus of claim 1, wherein the barrier is supported by the substrate.

4. The apparatus of claim 1, wherein the wire is round wire.

5. The apparatus of claim 2 wherein the heat spread and the barrier are configured to limit an amount of under fill material wicking from spaces between the plurality of die.

6. The apparatus of claim 1, wherein the bottom die comprises a logic die and the plurality of die comprises a plurality of memory die.

7. The apparatus of claim 2, a lid coupled to the substrate and configured to enclose the bottom die, the plurality of die, the heat spreader, and the barrier.

8. The apparatus of claim 2, wherein the heat spreader and the barrier are commensurate in height with a top of the plurality of die.

\* \* \* \* \*